(12) United States Patent
Devnath et al.

(10) Patent No.: US 7,454,647 B1
(45) Date of Patent: Nov. 18, 2008

(54) APPARATUS AND METHOD FOR SKEW MEASUREMENT

(75) Inventors: Varadarajan Devnath, Santa Clara, CA (US); Vijaya Ceekala, San Jose, CA (US); James B. Wieser, Pleasanton, CA (US); Lawrence K. Whitcomb, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 434 days.

(21) Appl. No.: 11/192,426

(22) Filed: Jul. 28, 2005

(51) Int. Cl.
 *G06F 1/00* (2006.01)
 *G01R 13/00* (2006.01)
(52) U.S. Cl. .................................. 713/500; 702/72
(58) Field of Classification Search ................ 713/500, 713/503; 702/72
 See application file for complete search history.

(56) References Cited

U.S. PATENT DOCUMENTS

| 6,737,852 | B2* | 5/2004 | Soma et al. | 324/76.74 |
| 6,812,727 | B2* | 11/2004 | Kobayashi | 324/765 |
| 7,275,173 | B2* | 9/2007 | Lindt | 713/500 |
| 2002/0196067 | A1* | 12/2002 | Schultz | 327/291 |

\* cited by examiner

*Primary Examiner*—Mark Connolly

(57) ABSTRACT

A skew measurement system and method wherein each of the signals among which the skew is to be determined is connected one at a time to a clock recovery loop. The locked state of the clock recovery loop is used as an indicator of the skew of the data signal relative to the internal clock of the clock recovery loop. By measuring the difference between the locked state of different signals, their relative skew can be measured.

20 Claims, 3 Drawing Sheets

US 7,454,647 B1

APPARATUS AND METHOD FOR SKEW MEASUREMENT

TECHNICAL FIELD OF THE INVENTION

The present invention is generally directed to signal transmission in electronic devices.

BACKGROUND OF THE INVENTION

In many electronic devices, the backplane systems that are used for inter-chip communication transmit a clock along with the data. This clock is used at the end of the backplane trace to latch the output data in. Other backplane systems transmit a data bus along with a synchronous clock. These systems require a tight skew control between the clock and the data bus as well as among the individual members of the data bus. An automated measurements system is required in a production/test environment to measure this skew in order to ensure compliance to the relevant specifications.

Therefore, there is a need in the art for a more effective and efficient means of skew measurement.

SUMMARY OF THE INVENTION

A preferred embodiment includes a skew measurement system and method wherein each of the signals among which the skew is to be determined is connected one at a time to a clock recovery loop. The locked state of the clock recovery loop is used as an indicator of the skew of the data signal relative to the internal clock of the clock recovery loop. By measuring the difference between the locked state of different signals, their relative skew can be measured.

To address deficiencies of the prior art, it is a primary object of the present invention to provide a method for skew measurement, comprising receiving a first data signal; determining a first value corresponding to a phase offset of the first data signal; receiving a second data signal; determining a second value corresponding to a phase offset of the second data signal; and calculating a skew measurement from the first value and the second value.

According to one embodiment of the present invention, there is provided a skew measurement system, comprising means for receiving a first data signal; means for determining a first value corresponding to a phase offset of the first data signal; means for receiving a second data signal; means for determining a second value corresponding to a phase offset of the second data signal; and means for calculating a skew measurement from the first value and the second value.

According to one embodiment of the present invention, there is provided a skew measurement system, comprising a clock phase generator configured receive a control word input and to generate an output clock signal with a phase offset the control word; a phase detector configured to compare the output clock signal with an input data signal and to generate a comparison output; an adaptation block configured to generate the control word according to the comparison signal, wherein when the comparison signal indicates that the output clock signal corresponds to the input data signal, a value corresponding to the control word is stored.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
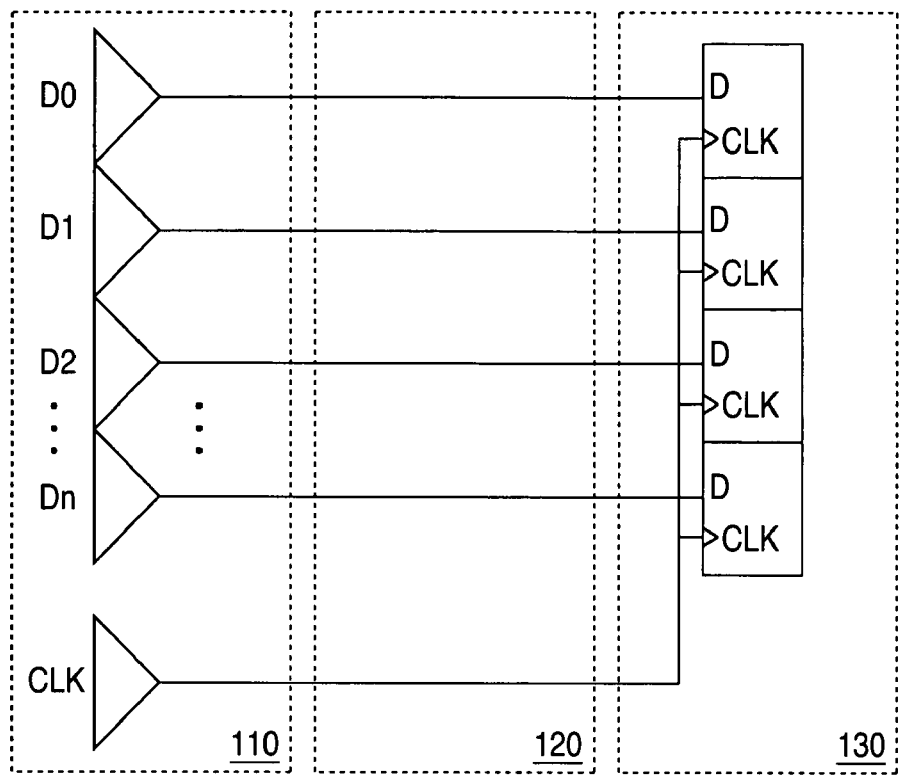
FIG. 1 illustrates a system in which a skew measurement system in accordance with a preferred embodiment can be used.

FIG. 1 illustrates a system in which a skew measurement system in accordance with the present invention can be used. In general, such a conventional system includes a driver chip 110 which drives the signal on the backplane trace 120, the backplane trace 120 itself, and the receiver chip 130 which receives the transmitted data. The data signals are shown in the block diagram as single-ended traces but they can be differential traces as well, as is the case in high-speed systems.

In this type of backplane system, a clock synchronous to the data is transmitted on the backplane 120 along with the data bus. The clock signal is used at the receiving chip 130 to latch the incoming data in. This system puts a tight constraint on the skew requirement among the individual members of the data bus as well as between the data and the clock.

Figure 2:
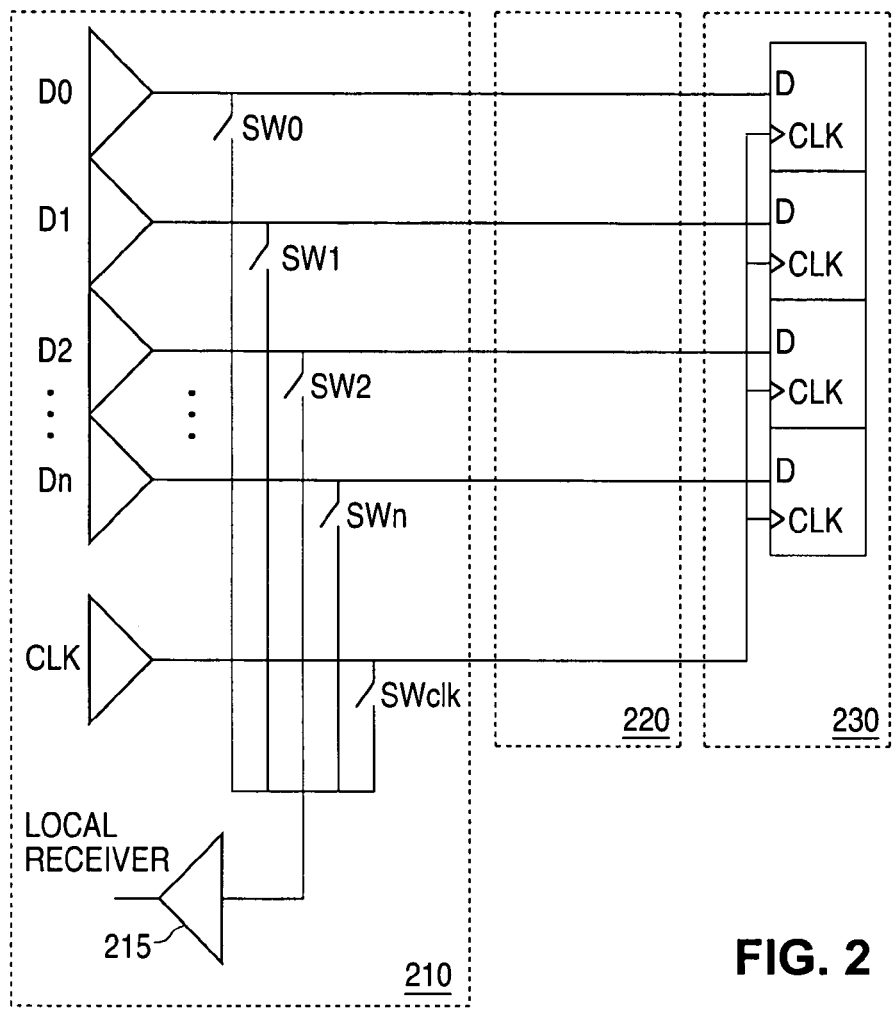
FIG. 2 depicts a block diagram of a circuit in accordance with a preferred embodiment.

FIG. 2 depicts a block diagram of a circuit in accordance with a preferred embodiment, including a driver chip 210 which drives the signal on the backplane trace 220, the backplane trace 220 itself, and the receiver chip 230 which receives the transmitted data. The skew measurement circuit includes switches SW0, SW1, . . . , SWn to loop back the data to a local receiver 215. It also includes a switch SWclk to loop back the clock signal, which can be divided-down, to the local receiver.

Figure 3:
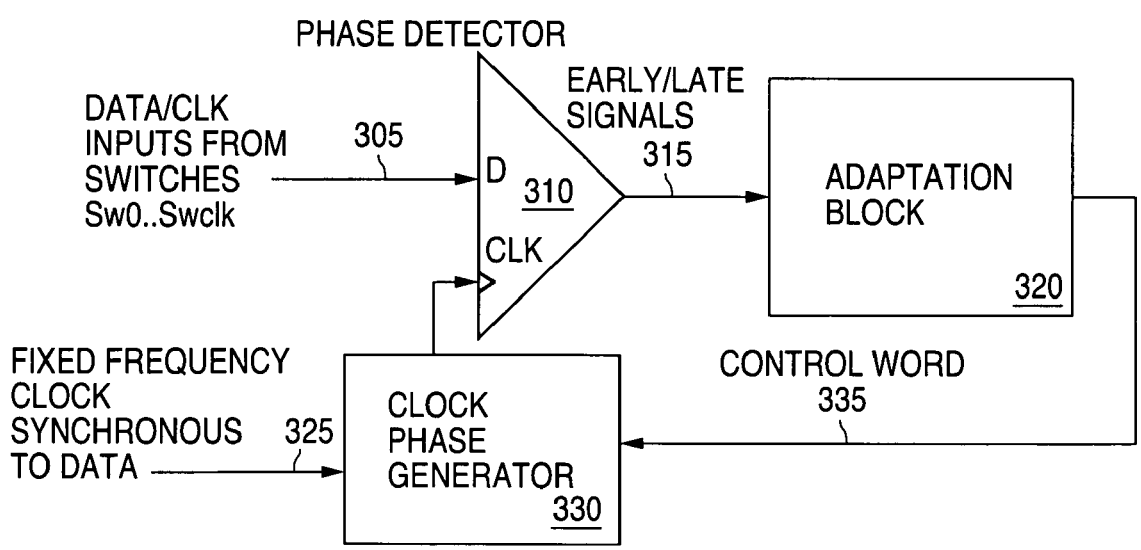
FIG. 3 depicts a block diagram of a local receiver circuit in accordance with a preferred embodiment.

FIG. 3 depicts a block diagram of a local receiver circuit in accordance with a preferred embodiment. The local receiver includes a phase detector 310, an adaptation logic block 320, and a clock phase generator 330. The phase detector 310 gets its data input 305 from the switch matrix SW0, SW1, . . . , SWclk. To connect a particular data bit to the phase detector 310, the corresponding switch is closed. For example, in order to connect D0 to the input of the phase detector, SW0 is closed an all other switches are left open. The phase detector 310 gets its clock input from the clock phase generator 330. The phase detector 310 produces early/late signals 315 as a comparison output depending on whether the clock leads the data or whether the clock lags the data.

The early/late signals 315 from the phase detector 310 go into an adaptation block 320. The adaptation block 320 takes the early/late signals 315 and low-pass filters them. This can be achieved in an analog fashion by using a capacitor or in a digital fashion by using an accumulator, as will be recognized by those of skill in the art. This accumulated value is converted to a control word 335 which can be interpreted by the clock phase generator 330.

The clock phase generator 330 takes the control word 335 from the accumulator. The clock phase generator 330 takes a fixed frequency clock 325 which is synchronous to the incoming data. It generates a multiplicity of equally-spaced phases. Depending on the control word 335 input to this block, it chooses one particular generated clock phase as its output.

When a suitable control word has been found, as described herein, the adaptation block 320, in a preferred embodiment, can store a value corresponding to the control word, and can compute the skew by comparing different stored control words. Preferably, the stored words correspond to different input signals.

Figure 4:
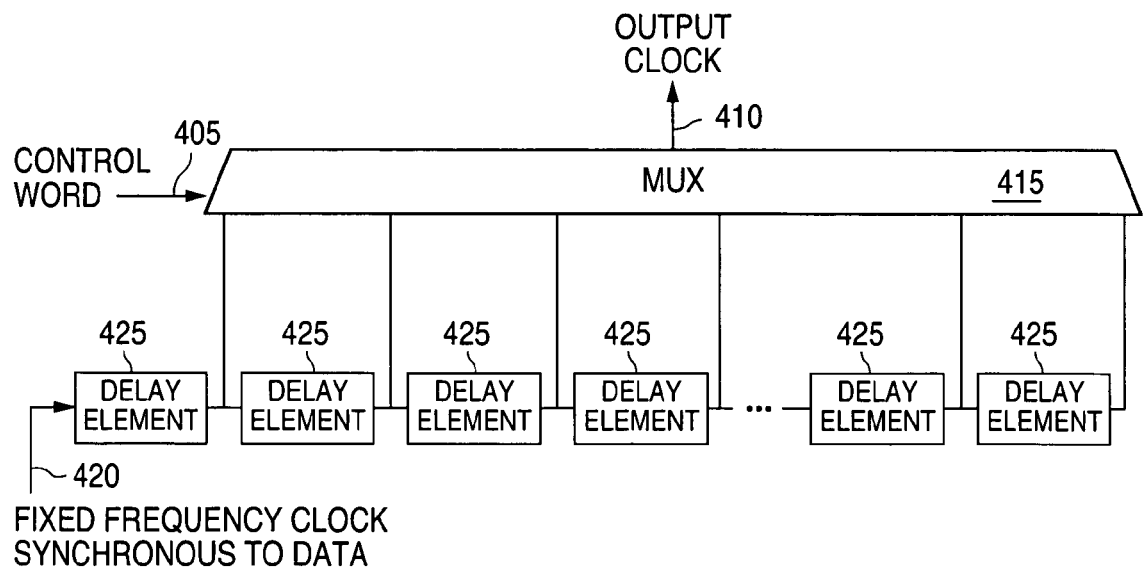
FIG. 4 depicts a block diagram of a clock phase generator implemented as a delay chain made up of a series of delay elements, in accordance with an exemplary embodiment of the present invention.

FIG. 4 depicts a block diagram of a clock phase generator implemented as a delay chain made up of a series of delay elements 425, in accordance with an exemplary embodiment of the present invention. Each delay element 425 produces one phase of the clock 420. The delay elements 425 have similar delays so that the clock phases produced by each of these delay elements 425 are equally spaced. A multiplexer 415 selects one of the clock phases produced to be the output clock 410 depending on the input control word 405.

Alternately, the clock phase generator can be implemented as a phase interpolator. A clock interpolator such as this takes a fixed number (usually 4-6) of clock phases at a fixed frequency which is synchronous to the data. It then generates several clock phases between each of the input clock phases at equally-spaced intervals. For example, a phase interpolator could take in six input clock phases and generate eight phases between each of the input phases. This way, the phase interpolator produces 6*8=48 equally-spaced phases. One of the clock phases is chosen as the output 410 depending on the control word.

The clock phase generator can be implemented in any other suitable fashion so long as it is able to produce equally-spaced clock phases and can choose one of the phases depending on the input control word.

When the loop is active, the adaptation block, based on the early/late inputs it receives from the phase detector, changes the control word so that the clock phase generator output transitions in the middle of the input data eye, or otherwise corresponds to the input data in a predetermined manner.

Figure 5:
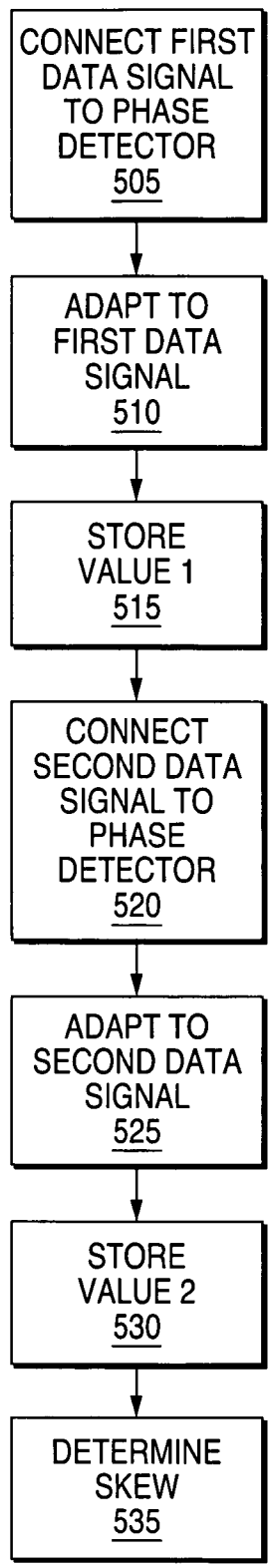
FIG. 5 depicts a flowchart of a process for skew measurement between data pairs according to an exemplary embodiment of the present invention.

FIG. 5 depicts a flowchart of a process for skew measurement between data pairs. In this example, the skew between D0 and D1 of a circuit as shown in FIG. 2 is measured. The process applies as well for measuring the skew between other pairs.

First, D0 is connected to the input of the phase detector (step 505) by closing switch SW0 and opening all of the other switches. The drivers are configured to output valid data.

Next, the loop is enabled and adapted so that the clock from the clock phase generator transitions in the middle of the data eye (step 510). That is, the clock phase generator receives and uses multiple control words to generate clock signals until an appropriately-phased clock signal is found. The control word for the clock phase generator is then noted and stored (value1) (step 515).

Next, D1 is connected to the input of the phase detector (step 520) by closing switch SW1 and opening all of the other switches.

Next, the loop is enabled and adapted so that the clock from the clock phase generator transitions in the middle of the data eye (step 525). The control word for the clock phase generator is noted and stored (value2) (step 530).

The skew between do and dl is determined as the difference between value1 and value2 (step 535).

The control word can be coded in several ways, e.g. binary, gray scale, thermometer, etc., as known to those of skill in the art. The difference determined in step 535 should account for the coding of the control word.

Figure 6:
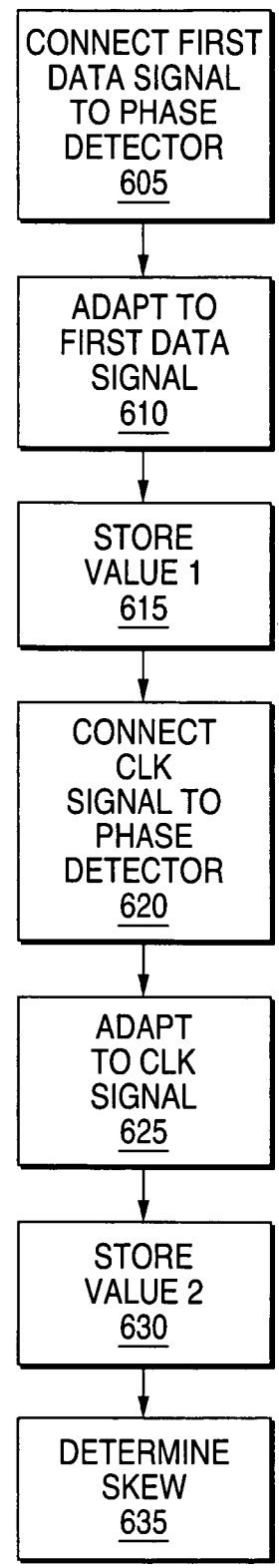
FIG. 6 depicts a flowchart of a process for skew measurement between a data signal and a clock signal according to an exemplary embodiment of the present invention.

FIG. 6 depicts a flowchart of a process for skew measurement between a data signal and a clock signal. In this example, the skew between D0 and clk of a circuit as shown in FIG. 2 is measured. The process applies as well for measuring the skew between the clock and other data signals.

First, D0 is connected to the input of the phase detector (step 605) by closing switch SW0 and opening all of the other switches. The drivers are configured to output valid data.

Next, the loop is enabled and adapted so that the clock from the clock phase generator transitions in the middle of the data eye (step 610). The control word for the clock phase generator is noted and stored (value1) (step 615).

Next, clk is connected to the input of the phase detector (step 620) by closing switch SWclk and opening all of the other switches. Of course, a divided-down clock or other signal directly corresponding to clk can be used.

Next, the loop is enabled and adapted so that the clock from the clock phase generator transitions in the middle of the data eye (step 625). That is, the clock phase generator receives and uses multiple control words to generate clock signals until an appropriately-phased clock signal is found. The control word for the clock phase generator is noted and stored (value2) (step 630).

The skew between d0 and clk is determined as the difference between value1 and value2 (step 635).

The control word can be coded in several ways, e.g. binary, gray scale, thermometer, etc., as known to those of skill in the art. The difference determined in step 635 should account for the coding of the control word.

Those of skill in the art will recognize that the steps described above need not necessarily be performed in the precise order described.

On-chip skew measurement, as described herein, has many applications. For example, by adding a programmable delay on each output, the result of the skew measured above can be used to equalize the delay on all outputs. This way, the on-chip path differences among the various data bits can be reduced. Additionally, a programmed offset can be added to compensate for off-chip skews if they can be measured by other means.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for skew measurement, comprising:
    receiving a first data signal;
    determining a first value corresponding to a phase offset of the first data signal;
    receiving a second data signal;
    determining a second value corresponding to a phase offset of the second data signal;
    calculating a skew measurement from the first value and the second value; and
    comparing the first data signal to a plurality of signals, each of the plurality of signals having a different phase offset and an associated control word value.

2. The method of claim 1, further comprising generating a plurality of reference signals, each reference signal having a different phase offset.

3. The method of claim 1, wherein the skew measurement between the first data signal and the second data signal is the difference between the first value and the second value.

4. The method of claim 1, wherein the second data signal is a clock signal.

5. The method of claim 1, further comprising setting a switch to connect the first data signal to a skew measurement circuit.

6. The method of claim 1, wherein the first data signal and the second data signal are selected from a plurality of data signals communicated in a semiconductor processor.

7. A method for skew measurement, comprising:
    receiving a first data signal;
    determining a first value corresponding to a phase offset of the first data signal;
    receiving a second data signal;
    determining a second value corresponding to a phase offset of the second data signal;
    calculating a skew measurement from the first value and the second value; and
    generating a plurality of reference signals, each reference signal having a different phase offset.

8. A skew measurement system, comprising:
    means for receiving a first data signal;
    means for determining a first value corresponding to a phase offset of the first data signal;
    means for receiving a second data signal;
    means for determining a second value corresponding to a phase offset of the second data signal; and
    means for calculating a skew measurement from the first value and the second value; and
    means for comparing the first data signal to a plurality of signals, each of the plurality of signals having a different phase offset and an associated control word value.

9. The system of claim 8, further comprising means for generating a plurality of reference signals, each reference signal having a different phase offset.

10. The system of claim 8, wherein the skew measurement between the first data signal and the second data signal is the difference between the first value and the second value.

11. The system of claim 8, wherein the second data signal is a clock signal.

12. The system of claim 8, further comprising means for setting a switch to connect the first data signal to a skew measurement circuit.

13. The system of claim 8, wherein the first data signal and the second data signal are selected from a plurality of data signals communicated in a semiconductor processor.

14. A skew measurement system, comprising:
    means for receiving a first data signal;
    means for determining a first value corresponding to a phase offset of the first data signal;
    means for receiving a second data signal;
    means for determining a second value corresponding to a phase offset of the second data signal; and
    means for calculating a skew measurement from the first value and the second value; and
    means for generating a plurality of reference signals, each reference signal having a different phase offset.

15. A skew measurement system, comprising:
    a clock phase generator configured to receive a control word input and to generate an output clock signal with a phase offset the control word;
    a phase detector configured to compare the output clock signal with an input data signal and to generate a comparison output;
    an adaptation block configured to generate the control word according to the comparison output,
    wherein when the comparison signal indicates that the output clock signal corresponds to the input data signal, a value corresponding to the control word is stored.

16. The skew measurement system of claim 15, the input data signal is a clock signal.

17. The skew measurement system of claim 15, wherein the clock phase generator selects one of a plurality of clock signals, each with a different phase offset, as the output clock signal according to the control word.

18. The skew measurement system of claim 15, wherein the comparison output indicates whether the input data signal lags or leads the output clock signal.

19. The skew measurement system of claim 15, wherein a comparison of the values stored for different input data signals indicates the skew between the different input data signals.

20. The skew measurement system of claim 15, wherein the skew measurement system is capable of storing at least two values corresponding to control words.

* * * * *